United States Patent [19]

Pham Ngu

[11] Patent Number: 4,513,398
[45] Date of Patent: Apr. 23, 1985

[54] BISTABLE LOGIC CIRCUIT USING FIELD EFFECT TRANSISTORS WITH A LOW VOLTAGE THRESHOLD AND STORAGE DEVICE INCORPORATING SUCH A CIRCUIT

[75] Inventor: Tung Pham Ngu, Paris, France

[73] Assignee: Thomson-CSF, Paris, France

[21] Appl. No.: 408,278

[22] Filed: Aug. 16, 1982

[30] Foreign Application Priority Data

Aug. 21, 1981 [FR] France .................. 81 16114

[51] Int. Cl.³ ............................ G11C 11/40
[52] U.S. Cl. ...................... 365/189; 365/175; 365/154
[58] Field of Search ............ 365/174, 175, 189, 230, 365/154

[56] References Cited

U.S. PATENT DOCUMENTS 4,394,589  7/1983  Pham et al. .
4,402,127  9/1983  Pham et al. .
4,442,509  4/1984  Herndon .................. 365/175

FOREIGN PATENT DOCUMENTS 0021858  1/1981  European Pat. Off. .

OTHER PUBLICATIONS

"High-Speed Low-Power Logic IC's Using Quasi-Normally-Off GaA's MESFET" by Gerard Nuzillat et al., IEEE, Journal of Solid-State Circuits, vol. SC-16, No. 3, Jun. 1981, pp. 226–232.

Primary Examiner—Terrell W. Fears
Attorney, Agent, or Firm—James R. Longacre

[57] ABSTRACT

The logic circuit comprises two field effect transistors in series, whose gates are connected to the supply voltage by a first load. The source of the first field effect transistor is connected to earth. The drain of the second field effect transistor is connected on the one hand to the supply voltage by a second load and to the gate of a third field effect transistor, whose drain is connected to the supply voltage and whose source is connected to the common point constituted by the drain of the first field effect transistor and the source of the second field effect transistor via a Schottky diode.

14 Claims, 10 Drawing Figures

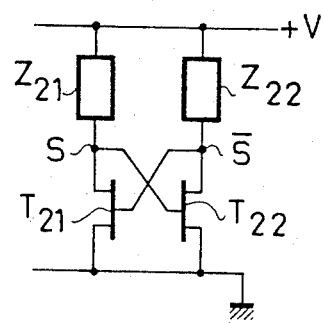
FIG. 1
(PRIOR ART)
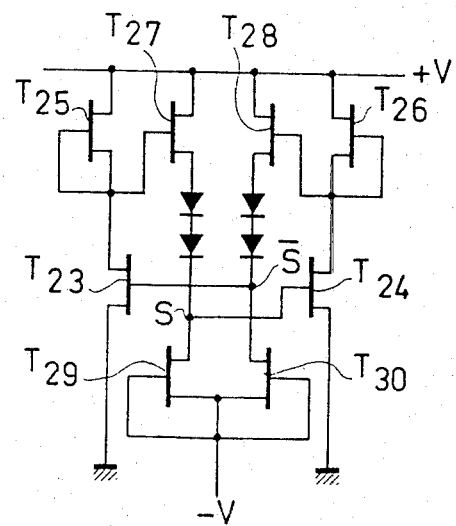
FIG. 2
(PRIOR ART)
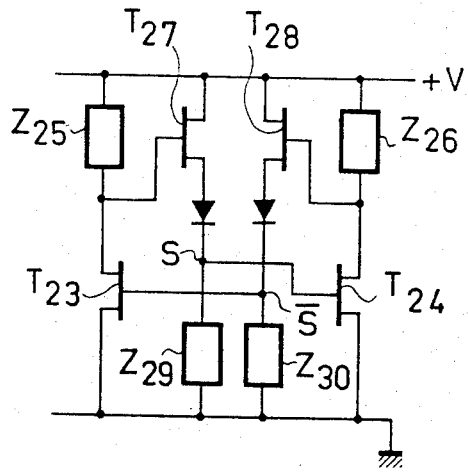
FIG. 3
(PRIOR ART)
FIG. 4

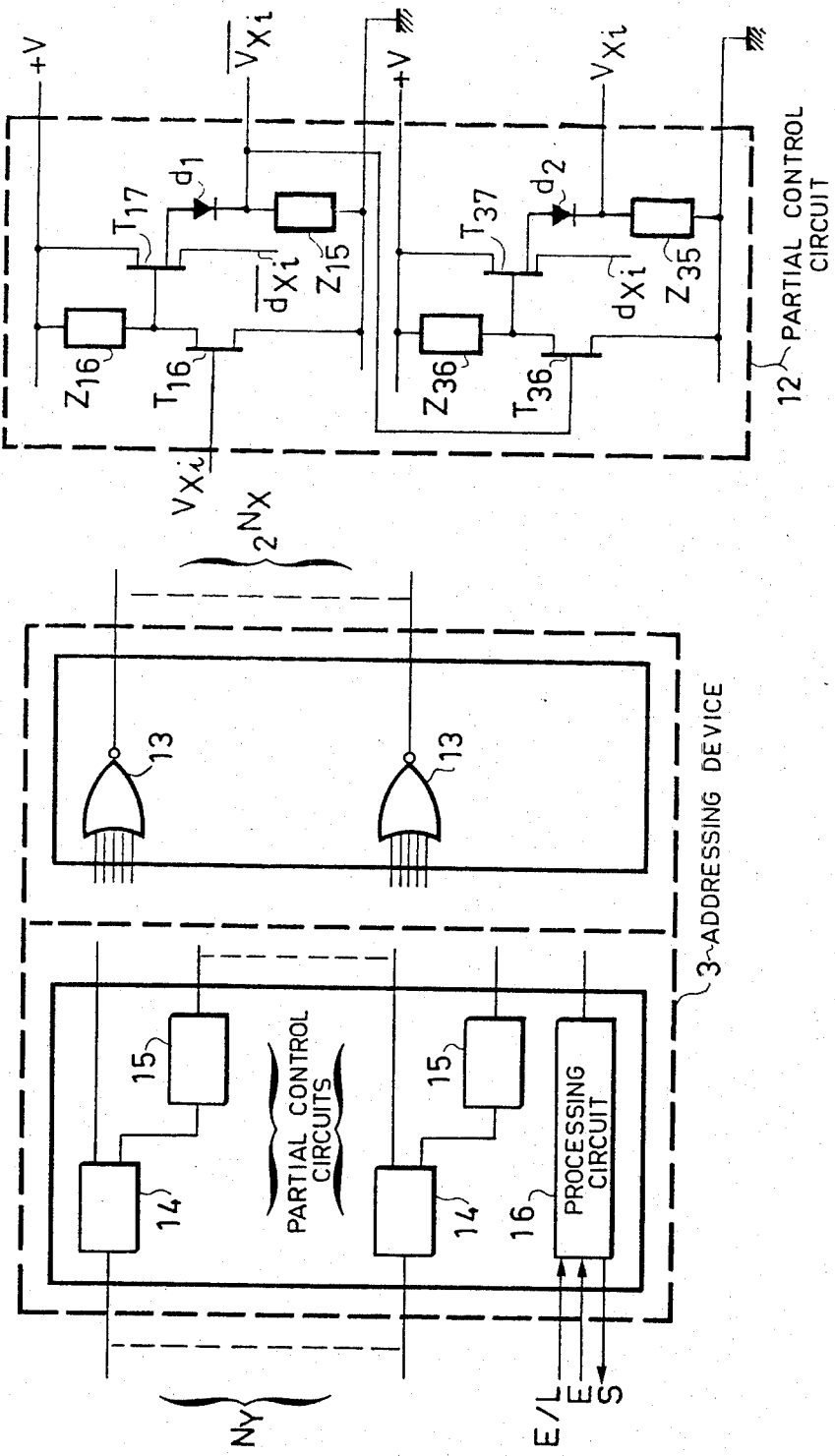

400# BISTABLE LOGIC CIRCUIT USING FIELD EFFECT TRANSISTORS WITH A LOW VOLTAGE THRESHOLD AND STORAGE DEVICE INCORPORATING SUCH A CIRCUIT

BACKGROUND OF THE INVENTION

The invention relates to a bistable logic circuit using field effect transistors with a low voltage threshold and a storage device incorporating such a circuit.

Static random access memories comprise matrices of active elements with two stable states, one corresponding to the state "0" and the other to the state "1". The addressing of each element, which is consequently a bistable circuit for reading or writing, takes place by the selection of the row and the column at the intersection of which the addressed element is located.

The quality and advantage of each type of memory essentially depends on the stability and reduced size of each element. It is known to produce these memories in "MESFET" technology on gallium arsenide (GaAs).

However, the high density of the memories requires a logic circuit technology with a very low consumption, which eliminates a logic with buffer store elements or buffered FET logic with "normally conductive MESFET" transistors, which is the only one whose technology has proved itself. In addition, there are logics comprising field effect transistors and Schottky diodes of the Schottky diode-FET logic type and high performance logics based on junction field effect transistors or Enhanced Junction FET Logics or "E.J.F.E.T.L", which indeed comply with the consumption criteria, but their technologies are too complex to be used for obtaining large-scale integration circuits (LSI).

European Patent Application No. 0 021 858 describes a new logic based on MESFET transistors having a very low negative threshold voltage, which meets various criteria of large-scale integration circuits, namely low consumption, simple technology and permitting a good tolerance in connection with manufacture.

BRIEF SUMMARY OF THE INVENTION

The invention proposes the realization of bistable circuits using this technology. It therefore relates to store elements which can have a very small surface area, can be easily integrated and consequently it is possible to obtain memories with a high integration density. Thus, on a gallium arsenide substrate, it makes it possible to produce static random access memories with a high density (more than 256 bits) and a very high access speed (less than 1 nanosecond).

The present invention therefore relates to a bistable logic circuit using field effect transistors with a low threshold voltage connected between the two terminals of a supply voltage generator, comprising two field effect transistors in series, whose gates are interconnected and connected to the first terminal of the supply voltage generator by a first load, the source of the first field effect transistor being connected to the second terminal of the supply voltage generator, the drain of the second field effect transistor being connected on the one hand to the first terminal of the supply voltage generator by a second load and on the other hand to the gate of a third field effect transistor, whose drain is connected to the first terminal of the supply voltage generator and the source to the common point constituted by the drain of the first transistor and by the source of the second transistor via a Schottky diode, said common point constituting the output terminal of the bistable circuit.

The invention also relates to a storage device comprising such a bistable circuit.

BRIEF DESCRIPTION OF THE DRAWINGS

The invention is described in greater detail hereinafter relative to non-limitative embodiments and the attached drawings, which show:

FIG. 1 shows a prior art bistable circuit.

FIG. 2 shows another prior art bistable circuit.

FIG. 3 shows still another prior art bistable circuit.

FIG. 4 shows a bistable circuit according to the present invention.

FIGS. 6 and 7 show details of the addressing devices of the memory illustrated in FIG. 5.

FIG. 8 shows the partial control circuit of FIG. 6.

DETAILED DESCRIPTION OF THE PREFERRED EMBODIMENTS

Figure 5:
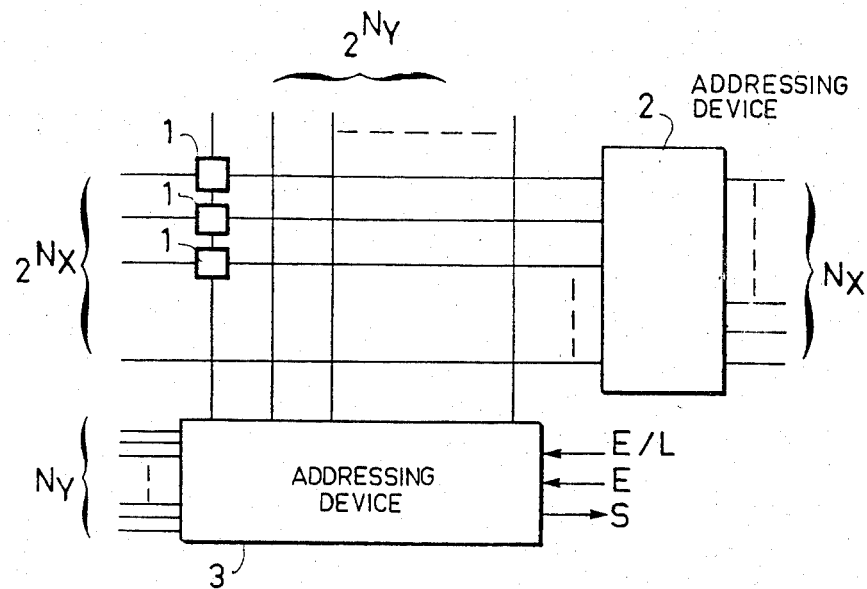
FIG. 5 is a block diagram of a memory incorporating bistable circuits according to the present invention.

The circuits in question can be connected between the two terminals of a supply voltage generator and for simplification purposes they are considered to be between earth and voltage $+V$.

The invention uses the technology of MESFET logic circuits with a slightly negative threshold voltage and which are also called "quasi-normally blocked" MESFET. The main element of the invention is a bistable flip-flop, which can be used as an elementary cell for the static random access memories. Generally a bistable flip-flop is implemented by intersecting two logic reversing switches in the manner shown in FIG. 1, while considering a direct coupled FET logic (DCFL).

FIG. 2 shows a buffered FET logic (BFL) with normally conductive MESFET's. Transistors $T_{25}$, and $T_{26}$, $T_{29}$ and $T_{30}$, each have their gate connected to their source, and serve as saturable resistors. In this case it is ncessary to use two voltage sources having opposite signs.

Finally FIG. 3 considers a low threshold FET logic (LTFL), making it possible to use only a single voltage source. In the case of MESFET's, they are of the quasi-normally blocked type. Hereinafter consideration will only be given to field effect transistors of this type.

FIG. 4 shows the bistable circuit according to the invention. This bistable flip-flop has numerous advantages compared with the crossed reversing switches illustrated hereinbefore, i.e. its simplicity, the smaller number of elements and the fact that there are no crossing connections among the elements. These characteristics help to save space for the high density circuits. In addition, this cell is simple to address, which simplifies the access logic circuits.

The bistable circuit comprises two field effect transistors of the quasi-normally blocked type $T_1$ and $T_2$ in series, whose gates are connected to $+V$ by the same load $Z_1$. The source of $T_1$ is connected to earth. The drain of $T_2$ is connected on the one hand to $+V$ by a load $Z_2$ and on the other to a gate of $T_3$. The drain of $T_3$ is connected to $+V$ and its source is looped to the common point formed by the drain of $T_1$ and the source of $T_2$ by a Schottky diode $d_{c2}$. This common point forms the output of the bistable circuit. These loads $Z_1$ and $Z_2$ are resistive loads, and can in particular be saturable resistors. Throughout the remainder of the following description when reference is made to load $Z_1$, it is loads of this type which are being considered. Reference is also made hereinafter to "low level", which corresponds to state "0" and "high level" which corresponds to state "1".

The following characteristic voltages are obtained:
$V_T$=threshold voltage of the field effect transistors
$V_H$=high level
$V_B$=low level
$V_{OS}$=opening voltage of the Schottky diodes $$(V_{OS}=0.7 \text{ V})$$

$V_S$=threshold switching voltage defined by $$i_T(V_S)=i_Z$$

with $i_T(V_S)$=current of the field effect transistor when $V_{GS}=V_S$
$i_Z$=current of the load Z
$V_{di}$=failure voltage of the field effect transistors relative to load $$Z(V_{di}\approx 0.2 \text{ volt}).$$

Figure 9:
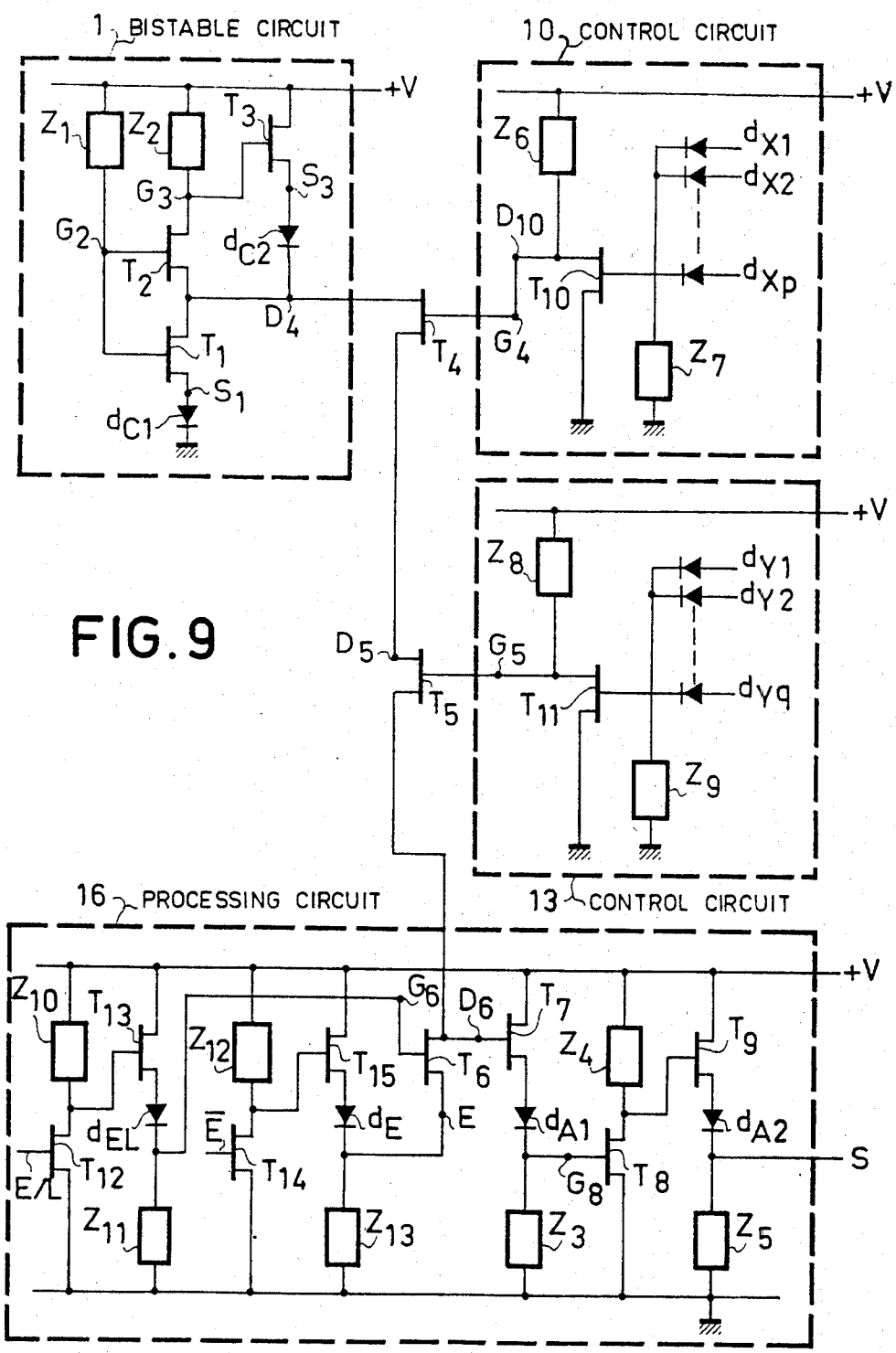
FIG. 9 shows a storage device using the bistable circuits of FIG. 4.

For the remainder of the description, a Schottky diode $d_{c1}$ is introduced between the source of transistor $T_1$ and earth, as shown in FIG. 9. This in no way modifies the operation of this bistable circuit but, on considering a memory using these bistable circuits and its basic elements, it makes it possible to work in the blocked-saturated from with MESFET field effect transistors of the quasi-normally blocked type.

On the basis of FIG. 9, Table 1 at the end of the description shows the two stable states of the cell. $V_{di}$ is the failure voltage in transistor $T_i$, $V_{OS}$ the Schottky voltage and $V_{S3}$ the voltage at point $S_3$, and these descriptions will be used throughout the text. In addition, $V_{D4}$ is the voltage at point $D_4$ and $V_{S3}$ is the switching threshold voltage of $T_3$ with respect to $i_{T1}$.

Thus, there are two states:
State "0": $T_1$ and $T_2$ conductive, $T_3$ blocked
State "1": $T_1$ and $T_3$ conductive, $T_2$ blocked.

This bistable flip-flop used in the memory cell functions as a "current mirror" between field effect transistors $T_1$ and $T_2$ and if $T_2$ is conductive, $T_3$ is blocked and vice versa.

It has been shown hereinbefore that the state of the cell is linked with that of transistor $T_2$. Thus, the flip-flop can be forced towards one of the two stable states by acting on $V_{D4}$:
If $$V_{GS2}=V_{G2}-V_{D4}<V_{S2}$$

$V_{GS2}$ being the voltage between the gate and the source of transistor $T_2$.

$V_{S2}$: switching threshold voltage of $T_2$ with respect to $Z_2$, $T_2$ becoming conductive and the cell switching to state "0".

However, if $$V_{GS2}<V_{S2}$$

$T_2$ is blocked and the cell switches to state "1".

This leads to the following switching point of the circuit:

$$V_{D4}(S)=V_{G2}-V_{S2}=2V_{OS}-V_{S2}$$

The characteristic output levels of the flip-flop are consequently:

$$V_{D4}(H)=V-V_{S3}-V_{OS} \text{ (high level)}$$

$$V_{D4}(B)=V_{OS}+V_{d1} \text{ (low level)}$$

$$V_{D4}(S)=2V_{OS}-V_{S2} \text{ (threshold)}$$

FIG. 5 shows the diagram of a random access memory using bistable circuits 1 according to the invention.

The elements are placed in rows X and columns Y. Each row X is connected to addressing device 2 at X, which has $2^{NX}$ outputs and NX inputs, NX obviously being an integer, while $2^{NX}$ is the number of rows.

The $2^{NY}$ columns Y are connected to addressing device 3 at Y, which has NY inputs and two supplementary inputs. One of these inputs E/L assigns the alternate write or read functions for the information of the chosen element, while the second input E, in writing, permits the entry of data. Input E/L indicates to the device whether it is to assume a read or write function.

In both cases a row and a column are chosen. Thus, only the element at the intersection of the row chosen by addressing device 2 and the column chosen by addressing device 3 is able to record data "1" or "0" or to restore it, in accordance with the instruction received by input E/L.

In the case where a recording instruction is given, it records state "0" or "1", as a function of the voltage of input E. In the case of reading, it supplies the data contained therein at S, after selection of the desired row and column.

Figure 6:
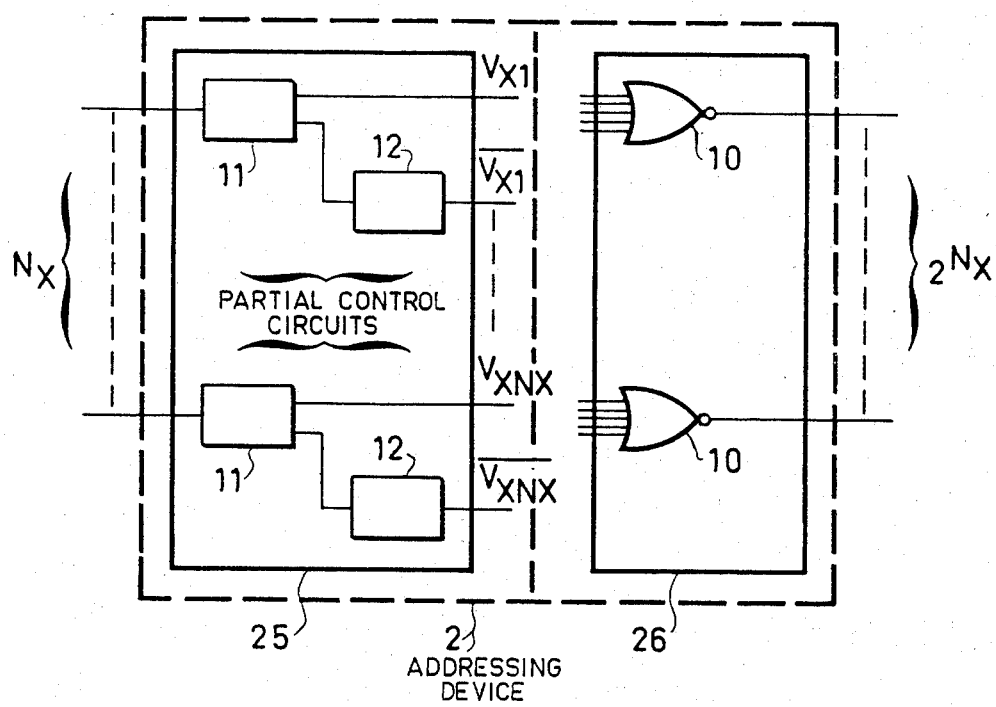

Thus, the elements of the static random access memory described here are as follows:
bistable memory cell described hereinbefore.
addressing gate X (rows)
addressing gate y (columns)
half-control circuit of input X (or Y)
read-write selection
write selection
reading amplifier FIG. 6 shows addressing device 2 at X. Each row X is controlled by a gate 10 making it possible to select the row number as a function of the levels applied to its input. These levels are obtained by two identical half-control circuits 11 and 12, which reproduce the complementary logic signals for the inputs of gates 10.

FIG. 7 shows the addressing device 3 at Y. Each column Y is controlled by a gate 13 making it possible to select the column number as a function of the levels applied to its input. These levels are obtained by means of two identical half-control circuits 14, 15 which reproduce the complementary logic signals for the inputs of gates 13.

Circuit 16 contains the read-write selection circuit into which is fed the signal E/L and the signal E for the entry of data in the case of writing: It also contains the reading amplifier which, in the case of reading, supplies output signal S.

Thus, FIG. 6 shows the diagram of addressing device 2 at X. It comprises 2 NX logic reversing circuits 11, 12 grouped in block 25 and $2^{NX}$ gates grouped in means 26. It is possible to take as an example NX=5, $2^{NX}$ consequently being equal to 32.

These half-control circuits are set up in the manner indicated in FIG. 6. Thus, two complementary outputs $V_{Xi}$ and $\overline{V_{Xi}}$ correspond to each input of means 25. Means 26 comprises 32 NOR gates, whose outputs are respectively brought into state 1, when the five inputs are at state "0". Each of these gates carries a number from 0 to 31.

However, of each line $V_{Xi}$ or $\overline{V_{Xi}}$ by definition one is always brought to level 1. Moreover, each number from 0 to 31 in binary notation is a five digit number, each of which is a 1 or a 0. Number 3 is for example written 00011.

To excite gate 3, it is merely necessary for it to be connected to lines $V_{X1}$, $V_{X2}$, $V_{X3}$ which are at level 0 and to lines $\overline{V_{X4}}$ and $\overline{V_{X5}}$, which are also at level 0.

Thus, for obtaining the address of line $X_j$, it is merely necessary to apply to the inputs the digits composed by the number j in order to obtain line $X_j$ and consequently select one line of the matrix.

It is therefore necessary to select one element of line $X_j$, that of column $Y_K$ for on the one hand writing data, or on the other hand for reading the data which it contains. This is the function of addressing device 3 at Y shown in FIG. 7. It fulfills the same function as addressing device 2 at X. However, it also has two inputs, namely input E/L controlling the writing or reading function of the data and input E, which in the case of writing, controls the entry of a "0" or a "1". Input E/L in the writing position makes it possible to obtain the data contained in the element addressed at output S.

FIG. 8 shows the half-control circuits, which are the same no matter whether rows or columns are considered, Thus, each half-control (11, 12 or 14, 15) reproduces the complementary logic signals making it possible to select the desired row and column numbers. Each half-control circuit has an input reversing stage constituted by a field effect transistor $T_{16}$ and a load $Z_{16}$ connected in the manner indicated in FIG. 8. The output stage is constituted by a field effect transistor $T_{17}$ with two independent sources, its drain being connected to the supply voltage +V. One of the sources is connected to earth by a diode $d_1$ and a load $Z_{15}$ in series and supplies output $\overline{V_{Xi}}$ for the second identical half-control circuit. The other source is connected to one line of $d_{xi}$ receiving the same signal as that corresponding to $\overline{V_{Xi}}$. The second half-control circuit comprises field effect transistors $T_{36}$, $T_{37}$ and loads $Z_{35}$, $Z_{36}$. The second source of $T_{37}$ constutes an output for diodes $d_{xi}$ receiving the signal corresponding to $V_{xi}$. These different elements are interconnected in the manner shown in FIG. 8.

FIG. 9 shows a storage device produced from the bistable circuit shown in FIG. 4. This bistable circuit 1 acts as a random access memory cell. Access to the cell takes place by means of field effect transistors $T_4$, $T_5$, respectively controlled by an addressing gate X (row) 10 and an addressing gate Y (column) 13.

The data input E is isolated by the field effect transistor $T_6$ controlled by a read-write selection system.

Each line X is controlled by a gate X 10 constituted by a field effect transistor $T_{10}$ and loads $Z_6$, $Z_7$ forming a simple single-stage reversing switch. This gate is addressed by diodes $d_{X1}$, $d_{X2}$ ... $d_{Xp}$ having a common base connected to the grid of transistor $T_{10}$. These elements are interconnected in the manner shown in FIG. 9. Access to column Y is obtained by means of field effect transistor $T_5$, whose gate is controlled by a gate Y 13 identical to the aforementioned gate X 10 with a field effect transistor $T_{11}$, loads $Z_8$ and $Z_9$ and diodes $d_{Y1}$, $d_{Y2}$ ... $d_{yq}$. These different elements are interconnected in the manner shown in FIG. 9.

Data input E is insulated by field effect transistor $T_6$, whose gate is controlled by the read-write selection system constituted by a logic reversing switch.

The elements of this read-write selection system are field effect transistors $T_{12}$, $T_{13}$, resistors $Z_{10}$, $Z_{11}$ and diode $d_{EL}$, said elements being interconnected in the manner shown in FIG. 9. The signals from E are supplied by a write selection system constituted by a logic reversing switch identical to that of the read-write selection system and whose elements are field effect transistors $T_{14}$, $T_{15}$, resistors $Z_{12}$, $Z_{13}$ and diode $d_E$, these elements being interconnected in the manner shown in FIG. 9.

The reading amplifier has two stages, the first stage being a following-displacing circuit, constituted by a field effect transistor $T_7$, diode $d_{A1}$ and resistor $Z_3$, while the second is a logic reversing switch of the same type as for the write system, whose elements are transistors $T_8$, $T_9$, resistors $Z_4$, $Z_5$ and diode $d_{A2}$, These elements are interconnected in the manner shown in FIG. 9.

In the case of writing of state "0", the situation is as represented in Table II at the end of the description.

In the first case considered (1), field effect transistors $T_6$, $T_5$ and $T_4$ are conductive. $V_{D4}$ is brought to low levels: the sum of the failure voltage drops of transistors $T_6$, $T_5$, $T_4$ with a current $i_{T6}$ exceeding the current for maintaining state "1": $i_{T6} - i_{T1}$. Thus, the cell is switched to state "0".

In the second state (2), column Y is not addressed, transistors $T_4$ and $T_6$ are conductive and transistor $T_5$ blocked.

In the third considered case (3), line X is not addressed, transistors $T_5$ and $T_6$ are conductive and transistor $T_4$ blocked.

In these two latter cases the memory cell is not addressed. Current $i_{T4}$ is equal to the sum of currents below current $i_{T3} - i_{T1}$: $i_{T5}(o)$ and $i_{T6}(o)$ being the stray currents in transistors $T_5$ and $T_6$ when they are blocked, thus the cell remains in a stable state.

In the fourth case reading of the memory cell takes place with transistors $T_4$ and $T_5$ conductive with transistor $T_6$ blocked. The stray currents are too low to change the state of the cell.

Therefore the conditions for switching to "0" are:

$$V_{D4} < V_{D4}(S)$$

($V_{D4}$ being the voltage at point $D_4$ and $V_{D4}(S)$ being the threshold voltage at the same point) and $$i_{T4} > i_{T3} - i_{T1}$$

In the case of the writing of state "1", the position is as represented in Table III at the end of the description.

Consideration will be given to the same four states as those studied hereinbefore in connection with the writing of state "0".

In the first considered case (1), field effect transistors $T_6$, $T_5$, $T_4$ are conductive while $D_4$ is forced to high level with a current $i_{T6} + i_{G4}$ exceeding the current $i_{T1}$ for maintaining in state "0". Thus, the cell switches to state "1".

In the second case (2) and third case (3), the unaddressed memory cells have remained stable, because the stray currents are low compared with $i_{T1}$. In the fourth case (4), the reading cell remains stable for the same reason.

The conditions for forcing to "1" are consequently:

$$V_{D4} > V_{D4}(S)$$

($V_{D4}$ being the voltage at point $D_4$ and $V_{D4}(S)$ the threshold voltage at the same point) and $i_{T4} > i_{T1}$ The order of magnitude of these levels is as follows:

The reading amplifier detects levels "0" and "1", as a function of whether $V_{G8}$ assumes voltages 0 or $V_{OS}$. Thus, $$V_{G8} = V_{D4} - V_{S7} - V_{OS}$$

This leads to the following conditions:

$V_{G8}(B) = V_{D4}(B) - V_{S7} - V_{OS}$ (low level)

with $V_{D4}(B) = V_{OS} + V_{d1}$ (Table 1)

→ $V_{G8}(B) - V_{d1} - V_{S7} < 0$ and $V_{G8}(H) = V_{D4}(H) - V_{S7} - V_{OS}$ (high level)

with $V_{D4}(H) = V - V_{S3} - V_{OS}$ (Table 1)

→ $V_{G8}(H) = V - 2V_{OS} - V_{S7} > V_{OS}$

By taking:

$V_{S3} + V_{S7} \simeq V_{OS} \simeq 0.7$ volt and $+ V > 4V_{OS}$
We obtain: $V \simeq 3$ volts
$V_{D4}(B) \simeq 0.8$ volt (low level)
$V_{D4}(H) \simeq 2$ volts (high level)
$V_{D4}(S) \simeq 1.2$ volts (threshold)

These levels show that the cell is very stable and has a considerable immunity to noise.

In summarizing, the different elements of the static memory described here have the characteristics shown in Table IV at the end of the description.

As level $V_{D2}$ is a following level as a function of the levels of the load up to 2 v ($V_{D3}$ follows up to 3 v).

Level F is a floating level. The single supply voltage is equal to 3 v.

Figure 10:
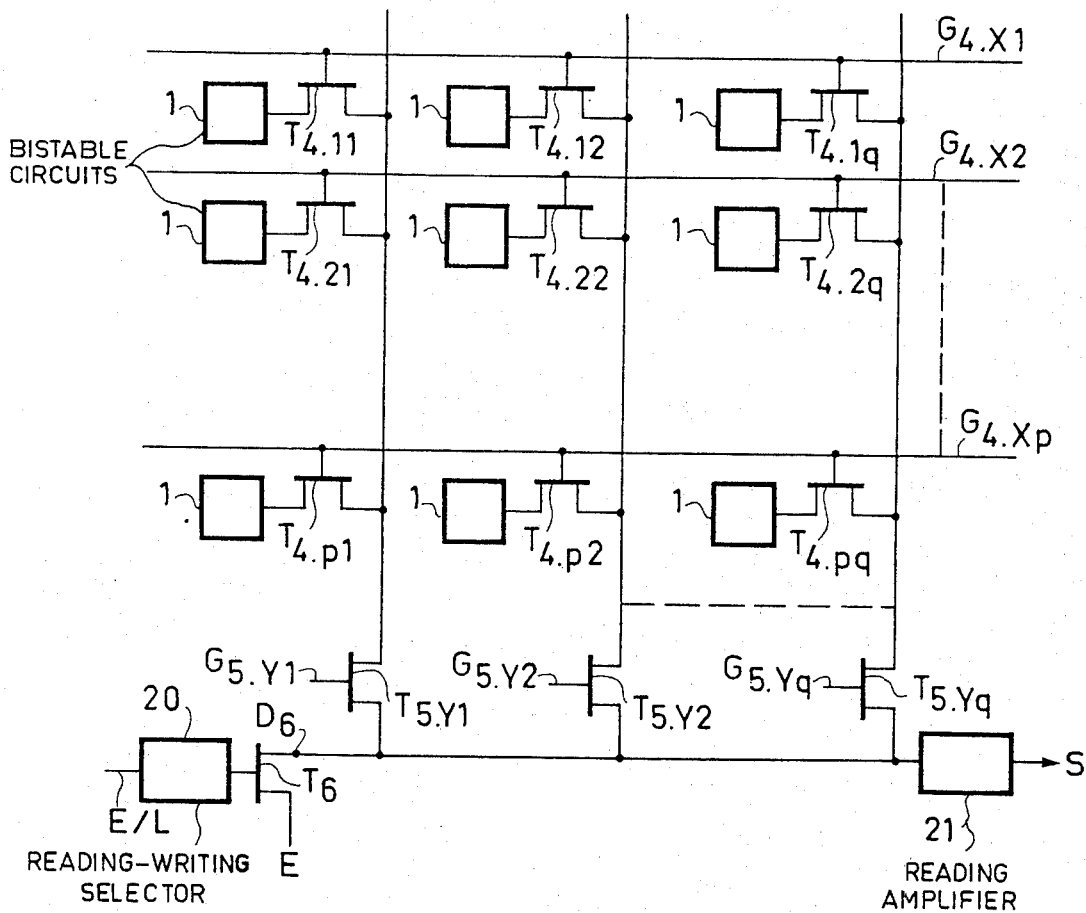
FIG. 10 shows an organization of the memory incorporating bistable circuits according to the invention.

The organization of the memory is shown in FIG. 10. The cells are grouped into p rows X and q columns Y. The rows group gates $G_4$ and the columns group sources $S_4$, $G_4$ and $S_4$ being the grids and the sources of transistors $T_4$ of each cell.

Each row is controlled by an addressing gate X. Access is obtained to each column by a field effect transistor $T_5$, whose gate is controlled by an addressing gate Y. It is also possible to replace transistors $T_4$ and $T_5$ corresponding to each cell by bigate transistors, each first gate being connected to the addressing row and each second gate to the addressing column in question.

The sources of field effect transistors $T_5$ are connected on the one hand to drain $D_6$ of field effect transistor $T_6$, which separates the access from the data input E and from the input of reading amplifier 21. Gate $G_6$ is controlled by the aforementioned read-write system 20. Gates X and Y are controlled by the half-control circuits X and Y.

The example of a 256 bit memory organized into 8 columns Y and 32 rows X is given in the following Table V. It is therefore possible to obtain a 256 bit memory in a surface area of 1 mm$^2$. On average the consumption is 100 $\mu$W, so that the total consumption is 30 mW.

As a function of the orders of magnitude, consideration can be given to the production of 1024 bit memories in 2×2 mm$^2$ areas with a consumption of only 120 mW. The access speed with respect to these memories can be below 1 nanosecond.

TABLE I

| Logic State | $V_{G2}$ | $V_{G3}$ | $V_{D4}$ | $V_{GS2}$ | $V_{GS3}$ |
|---|---|---|---|---|---|
| "0" | $2V_{OS}$ | $V_{OS} + V_{d1} + V_{d2}$ | $V_{OS} + V_{d1}$ | $V_{OS} - V_{d1}$ | $V_{d2} - V_{OS}$ |
| "1" | $2V_{OS}$ | $+V$ | $V - V_{S3} - V_{OS}$ | $3V_{OS} + V_{S3} - V$ | $V_{S3}$ |

TABLE II

| $V_E$ | $V_{G6}$ | $V_{G5}$ | $V_{G4}$ | $V_{D4}$ | $i_{T4}$ | Case |
|---|---|---|---|---|---|---|
| 0 | $V_{OS}$ | $V_{OS} + V_{d6}$ | $V_{OS} + V_{d6} + V_{d5}$ | $V_{d6} + V_{d5} + V_{d4}$ | $i_{T6} + i_{G4}$ | 1 |
| 0 | $V_{OS}$ | $V_{d11}$ | $V_{D4} + V_{OS}$ | $V_{D4}$ | $i_{T5}(0) + i_{G4}$ | 2 |
| 0 | $V_{OS}$ | $V_{OS} + V_{d6}$ | $V_{d10}$ | $V_{D4}$ | 0 | 3 |
| 0 | 0 | $V_{D4} + V_{OS}$ | $V_{D4} + V_{OS}$ | $V_{D4}$ | $i_{T6}(0) + i_{G4}$ | 4 |

TABLE III

| $V_E$ | $V_{G6}$ | $V_{G5}$ | $V_{G4}$ | $V_{D4}$ | $i_{T4}$ | Case |
|---|---|---|---|---|---|---|
| $V - V_{S15} - V_{OS}$ | $V - V_{S13} - V_{OS}$ | $V_{G4} + V_{d4}$ | $V_{D4} + V_{OS}$ | $V_E - V_{d6} - V_{d5} - V_{d4}$ | $I_{T6} + i_{G4}$ | 1 |
| $V - V_{S15} - V_{OS}$ | $V - V_{S13} - V_{OS}$ | $V_{d11}$ | $V_{D4} + V_{OS}$ | $V_{D4}$ | $i_{G4}$ | 2 |
| $V - V_{S15} - V_{OS}$ | $V - V_{S13} - V_{OS}$ | $V_E + V_{OS}$ | $V_{d10}$ | $V_{D4}$ | 0 | 3 |
| $V - V_{S15} - V_{OS}$ | 0 | $V_{D4} + V_{OS}$ | $V_{D4} + V_{OS}$ | $V_{D4}$ | $i_{G4}$ | 4 |

TABLE IV

| | | Output | | | Input | |
|---|---|---|---|---|---|---|
| Element | Type | High | Threshold | Low | High | Low |
| Memory cell | Bistable flip-flop | 2 | 1.2 | 0.8 | $V_{D3}$ | 0.2 |

TABLE IV-continued

| | Element | Type | Output High | Threshold | Low | Input High | Low |
|---|---|---|---|---|---|---|---|
| | Gate X | Simple reversing switch | $V_{D3}$ | | 0.2 | 1.4 | F |
| | Gate Y | Simple reversing switch | $V_{D3}$ | | 0.2 | 1.4 | F |
| Memory input controls | Half-control circuit X,Y | Double reversing switch + double output | 0.7 1.4 | | 0 F | 0.7 | 0 |
| | Read-write selection | Double reversing switch | $V_{D2}$ | | 0 | 0.7 | 0 |
| | Input selection | Double reversing switch | 2 | | 0 | 0.7 | 0 |
| Output | Reading amplifier | Following circuit + double reversing switch | $V_{D2}$ | | 0 | 2 | 0.8 |

TABLE V

| Element | Number | Unitary average surface area |
|---|---|---|
| Cell | 256 | 50 × 50 um² |
| Gate X | 32 | — |
| Half-control circuit X | 5 × 2 = 10 | — |
| Gate Y | 8 | — |
| Half-control circuit Y | 3 × 2 = 6 | — |
| Read-write selector | 1 | — |
| Data input selector | 1 | — |
| Reading amplifier | 1 | — |
| Total | 315 | 0.75 mm² |

What is claimed is:

1. A bistable logic circuit using field effect transistors with a low threshold voltage connected between first and second terminals of a supply voltage generator, comprising first, second and third field effect transistors, said first and second field effect transistors being in series with their gates interconnected and connected to the first terminal of the supply voltage generator by a first load, the source of the first field effect transistor being connected to the second terminal of the supply voltage generator, the drain of the first field effect transistor being connected to the source of the second field effect transistor, the drain of the second field effect transistor being connected on the one hand to the first terminal of the supply voltage generator by a second load and on the other hand to the gate of the third field effect transistor, whose drain is connected to the first terminal of the supply voltage generator and whose source is connected via a Schottky diode to the common point constituted by the drain of the first transistor and by the source of the second transistor, said common point constituting the output terminal of the bistable circuit.

2. A bistable circuit according to claim 1, which also comprises a Schottky diode polarized in the conductive direction inserted between the source of the first transistor and the second terminal of the supply voltage generator.

3. A storage device comprising memory cells, each one of said memory cells comprising:
a supply voltage generator having first and second terminals;
first and second field effect transistors the source of the second transistor being connected to the drain of the first field effect transistor, the gates of said first and second field effect transistors being interconnected and connected to said first terminal by a first load, the source of the first field effect transistor being connected to said second terminal, and the drain of the second field effect transistor being connected to said first terminal by a second load;
a first Schottky diode;
a third field effect transistor, having its gate connected to the drain of said second field effect transistor, its drain connected to said first terminal and its source connected via said first Schottky diode to the common point constituted by the drain of the first transistor and by the source of the second transistor, said common point constituting an output terminal; and
a second Schottky diode polarized in the conductive direction and inserted between the source of the first field effect transistor and said second terminal.

4. A storage device according to claim 3, wherein the memory cells form a matrix having addressing rows and columns, respectively X and Y, and corresponding addressing circuits X and Y permitting the selection of a desired cell.

5. A storage device according to claim 4, wherein the addressing circuit X comprises a fourth field effect transistor for selecting the memory cell, the drain of said fourth transistor being connected to an output point of the cell, while its gate is connected to an addressing row in X.

6. A storage device according to claim 5, wherein the addressing circuit Y comprises a fifth field effect transistor for selecting the memory cell, the drain of said fifth transistor being connected to the source of said fourth transistor, the gate of said fifth transistor being connected to an addressing column in Y.

7. A storage device according to claim 6, wherein the fourth and fifth field effect transistors are combined into a single bigate selection field effect transistor, one of the gates being connected to the addressing row at X and the other gate to the addressing column at Y.

8. A storage device according to claim 7, comprising a read-write mode selection device, said device being connected at its output to the gate of a transistor, whose drain is connected either to the source of said fifth field effect transistor or to the source of a bigate field effect transistor.

9. A storage device according to claim 8 wherein the read-write selection device is a logic reversing switch.

10. A storage device according to claim 7, comprising a reading circuit connected at the input to the drain of a transistor, which is also connected either to the source of said fifth field effect transistor, or to the source of a bigate field effect transistor.

11. A storage device according to claim 10, wherein the read circuit comprises two stages, the first stage being a following-displacing stage, while the second stage is a logic reversing switch.

12. A storage device according to claim 7, wherein each addressing circuit at X or Y comprises an NOR gate having several inputs and an output connected either to the drain of a selection transistor at X or Y, or to the drain of the bigate field effect transistor.

13. A storage device according to claim 12, wherein the inputs of the NOR gates are controlled by control circuits making it possible to select the desired row number and the desired column number.

14. A storage device according to claim 13, wherein these control circuits comprise two identical circuits, each circuit incorporating an input reversing stage, the output stage being comprised by a field effect transistor with two independent sources.

* * * * *